United States Patent
Tu et al.

(10) Patent No.: US 7,778,087 B2
(45) Date of Patent: Aug. 17, 2010

(54) MEMORY PROGRAMMING METHOD AND DATA ACCESS METHOD

(75) Inventors: Chun-Yi Tu, Hsinchu (TW); Te-Chang Tseng, Hsinchu County (TW); Hideki Arakawa, Yokohama (JP); Takeshi Nakayama, Sanda (JP)

(73) Assignee: Powerchip Semiconductor Corp., Hsin-Chu (TW)

( * ) Notice: Subject to any disclaimer, the term of this patent is extended or adjusted under 35 U.S.C. 154(b) by 97 days.

(21) Appl. No.: 12/335,784

(22) Filed: Dec. 16, 2008

(65) Prior Publication Data

US 2009/0161426 A1 Jun. 25, 2009

(30) Foreign Application Priority Data

Dec. 25, 2007 (TW) ............................... 96149882 A

(51) Int. Cl.
*G11C 16/04* (2006.01)
(52) U.S. Cl. ..................... 365/185.28; 365/185.03; 365/185.17
(58) Field of Classification Search ............. 365/185.28
See application file for complete search history.

(56) References Cited

U.S. PATENT DOCUMENTS

| | | | |
|---|---|---|---|
| 7,299,314 B2* | 11/2007 | Lin et al. ............... | 711/103 |
| 7,388,780 B2* | 6/2008 | Arita ..................... | 365/185.03 |
| 7,453,735 B2* | 11/2008 | Li et al. ................ | 365/185.28 |
| 7,532,495 B2* | 5/2009 | Youn et al. ............. | 365/63 |
| 7,577,028 B2* | 8/2009 | Dover ................... | 365/185.03 |
| 7,609,558 B2* | 10/2009 | Hosono ................. | 365/185.23 |
| 7,633,802 B2* | 12/2009 | Mokhlesi .............. | 365/185.18 |
| 2005/0078519 A1* | 4/2005 | Shiga ................... | 365/185.17 |
| 2008/0094893 A1* | 4/2008 | Choi ..................... | 365/185.03 |

* cited by examiner

*Primary Examiner*—Son L Mai
(74) *Attorney, Agent, or Firm*—Muncy, Geissler, Olds & Lowe, PLLC

(57) ABSTRACT

A memory programming method is provided. A first programming operation is performed to program a multi level cell from an initial state to a first target state, which corresponds to a storage data and has a first threshold voltage range. A flag bit of the NAND flash is set to a first state to indicate that the first programming operation has been performed. A second programming operation is performed to program the multi level cell from the first target state to a second target state, which corresponds to the storage data and has a second threshold voltage range. The flag bit is set to a second state to indicate that the second programming operation has been performed.

16 Claims, 4 Drawing Sheets

MEMORY PROGRAMMING METHOD AND DATA ACCESS METHOD

CROSS REFERENCE TO RELATED APPLICATIONS

This Application claims priority of Taiwan Patent Application No. 96149882, filed on Dec. 25, 2007, the entirety of which is incorporated by reference herein.

BACKGROUND OF THE INVENTION

1. Field of the Invention

The invention relates to a memory programming method, and more particularly to a memory programming method for a NAND flash memory.

2. Description of the Related Art

A NAND flash is a memory proposed by Toshiba. NAND Flash is a non-volatile memory, thus maintaining data storage without power supply. Moreover, NAND flash has speedy programming time and erasing time. In a NAND flash, each storage cell occupies a relatively small chip area. Thus, a NAND flash has larger storage density than other memories.

In general, a NAND flash may be grouped into single level cells and multi level cells, wherein the multi level cell may store more than one bit per cell (such as '00', '01', '10' and '11'), thus having larger storage density than the single level cell.

FIG. 1A to FIG. 1C show the distribution diagrams of a threshold voltage when a multi level cell (MLC) is programmed, wherein the multi level cell is used to store a two-bit data. A most significant bit (MSB) and a least significant bit (LSB) of the two-bit data correspond to different pages, i.e. different addresses. For example, the least significant bit corresponds to a first page and the most significant bit corresponds to a second page, wherein an address of the first page (lower page) is lower than that of the second page (upper page) in the NAND flash. In addition, a logic state '11' of the two-bit data corresponds to an erased state of the multi level cell, wherein the erased state may also be an initial state for performing a programming operation.

FIG. 1A shows a distribution diagram of a threshold voltage $V_{th}$ during a first page (i.e. a lower page) programming operation of a conventional multi level cell. After the first page programming operation is completed, a two-bit data stored in the multi level cell may be a logic state '11' or '10'. Referring to FIG. 1A, the arrow A indicates that the multi level cell is programmed from the logic state '11' to the logic state '10', wherein the logic state '11' and the logic state '10' correspond to different threshold voltage ranges, respectively. Next, the first page programming operations of the multi level cells in the other adjacent bit lines are performed. FIG. 1B shows a distribution diagram of the threshold voltage $V_{th}$ during a second page (i.e. an upper page) programming operation of the multi level cell described in FIG. 1A. As shown in FIG. 1B, the arrow B indicates that the multi level cell is programmed from the logic state '11' to the logic state '01', and the arrow C indicates that the multi level cell is programmed from the logic state '10' to the logic state '00'. Next, the second page programming operations of multi level cells in the other adjacent bit lines are performed. FIG. 1C shows a threshold voltage offset of the multi level cell shown in FIG. 1B caused by a coupling effect. As shown in FIG. 1C, if the two-bit data is in the logic state '01' and '00', an offset $V_{offset1}$ between the practical threshold voltage range and the ideal threshold voltage range of the multi level cell exists due to the interferences caused by the second page programming operations of the other adjacent multi level cells and the coupling effect of the floating gates. Moreover, if the two-bit data is in the logic state '10', an offset $V_{offset2}$ between the practical threshold voltage range and the ideal threshold voltage range of the multi level cell exists due to the interferences caused by the first and second page programming operations of the other adjacent multi level cells and the coupling effect of the floating gates. The threshold voltage range of the programming operation (between a maximum threshold voltage $V_{max}$ and a minimum threshold voltage $V_{min}$) is increased when the offset value of the threshold voltage is increased.

Therefore, it is desired that a memory programming method be provided, which can decrease the offset of the threshold.

BRIEF SUMMARY OF THE INVENTION

Memory programming methods and data accessing methods are provided. An exemplary embodiment of such a memory programming method for a NAND flash with a plurality of multi level cells is provided. A first programming operation is performed to program the multi level cell from an initial state to a first target state, which corresponds to a first storage data and has a first threshold voltage range, wherein the first threshold voltage range is between a first voltage and a second voltage larger than the first voltage. A flag bit of the NAND flash is set to a first state to indicate that the first programming operation has been performed. A second programming operation is performed to program the multi level cell from the first target state to a second target state, which corresponds to the first storage data and has a second threshold voltage range, wherein the second threshold voltage range is between the second voltage and a third voltage larger than the second voltage. The flag bit is set to a second state to indicate that the second programming operation has been performed.

Furthermore, an exemplary embodiment of a data accessing method for a NAND flash with a plurality of multi level cells is provided. A first programming operation is performed to program the multi level cell from an initial state to a first target state, which corresponds to a first logic state of a two-bit data and has a first threshold voltage range, wherein the first threshold voltage range is between a first voltage and a second voltage larger than the first voltage. A flag bit of the NAND flash is set to a first state to indicate that the first programming operation has been performed. A second programming operation is performed to program the multi level cell from the first target state to a second target state, which corresponds to the first logic state and has a second threshold voltage range, wherein the second threshold voltage range is between the second voltage and a third voltage larger than the second voltage. The flag bit is set to a second state to indicate that the second programming operation has been performed. A reading operation is performed to obtain a read threshold voltage of the multi level cell. A logic state of the two-bit data stored in the multi level cell is determined according to the read threshold voltage and the flag bit.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
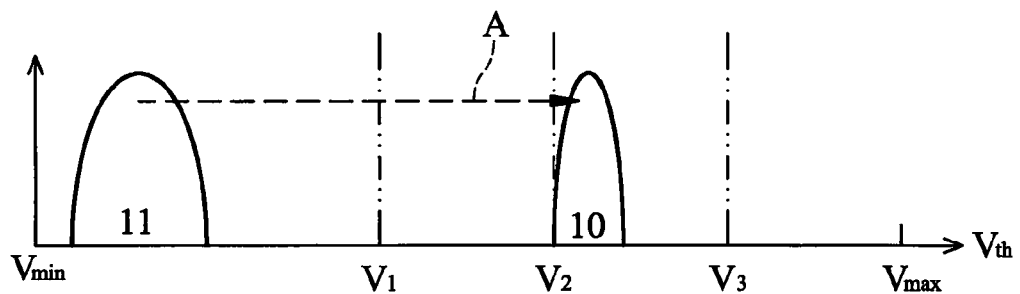
FIG. 1A shows a distribution diagram of a threshold voltage $V_{th}$ during a first page programming operation of a conventional multi level cell.
Figure 1B:
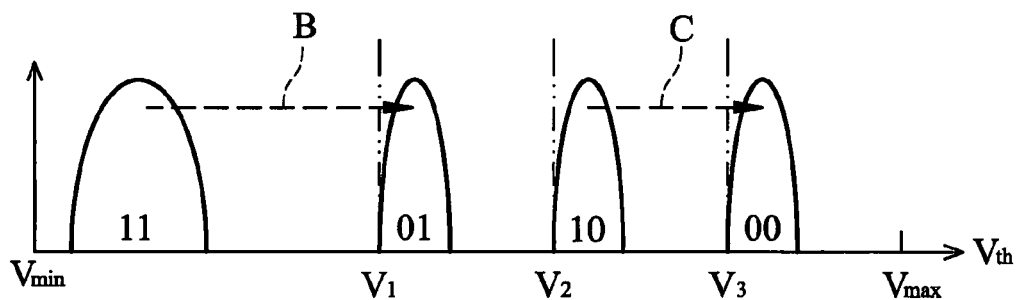
FIG. 1B shows a distribution diagram of the threshold voltage $V_{th}$ during a second page programming operation of the multi level cell described in FIG. 1A.
Figure 2A:
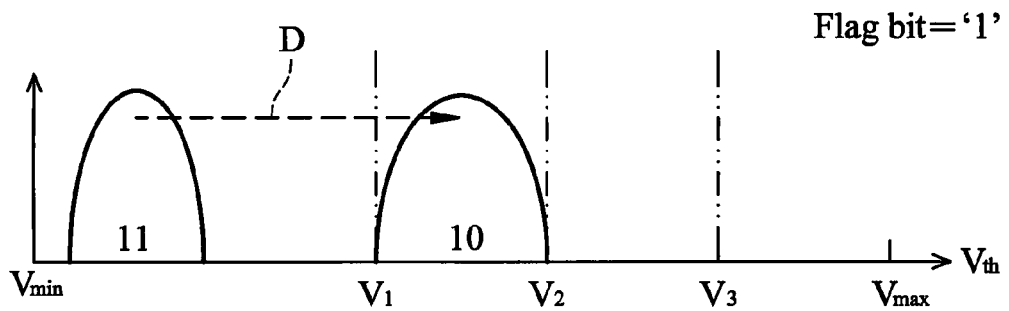
FIG. 2A shows a distribution diagram of a threshold voltage $V_{th}$ during a first page programming operation of a multi level cell according to an embodiment of the invention.

FIG. 2A shows a distribution diagram of a threshold voltage $V_{th}$ during a first page (i.e. a lower page) programming operation of a multi level cell according to an embodiment of the invention. After the first page programming operation is completed, a two-bit data stored in the multi level cell may be a logic state '11' or '10'. Compared to the threshold voltage range of the tradition logic state '10' (as shown in FIG. 1A, the tradition threshold voltage range is between the voltage $V_2$ and the voltage $V_3$,), the threshold voltage range of the logic state '10' shown in FIG. 2A is between the voltage $V_1$ and the voltage $V_2$, which forms a larger threshold voltage range. Furthermore, the threshold voltage range of the logic state '11' is between a minimum threshold voltage and the voltage $V_1$, i.e. the threshold voltage range of the logic state '11' is lower than the voltage $V_1$. Moreover, if the first page programming operation is completed, a flag bit corresponding to the multi level cell is set to a high logic level (i.e. '1'). In a NAND flash, the flag bit may be an auxiliary data or an annotated data. Next, programming the first page programming operation of the other adjacent multi level cells may be performed.

Figure 2B:
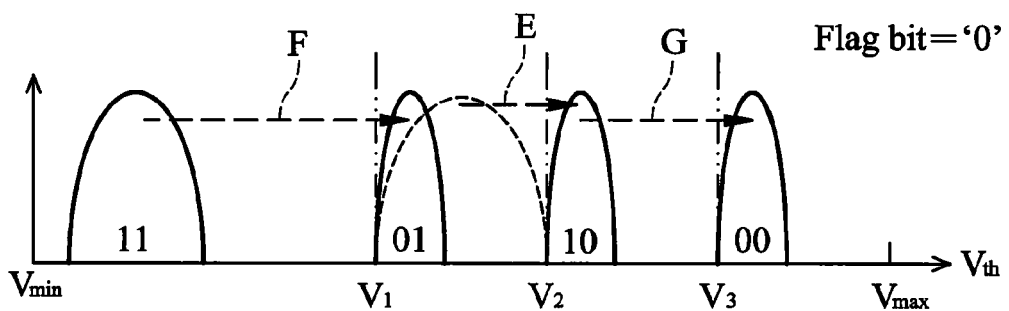
FIG. 2B shows a distribution diagram of a threshold voltage $V_{th}$ during a second page programming operation of the multi level cell according to the embodiment of the invention.

FIG. 2B shows a distribution diagram of a threshold voltage $V_{th}$ during a second page (i.e. an upper page) programming operation of the multi level cell according to the embodiment of the invention. After the second page programming operation is completed, the two-bit data stored in the multi level cell may be the logic state '11', '01', '10' or '00'. As shown in the arrow E of FIG. 2B, the threshold voltage range of the logic state '10' is programmed from a range between the voltage $V_1$ and the voltage $V_2$ to a range between the voltage $V_2$ and the voltage $V_3$, wherein $V_1<V_2<V_3$. In addition, the arrow F indicates that the multi level cell is programmed from the logic state '11' to the logic state '01', and the arrow G indicates that the multi level cell is programmed from the logic state '10' to the logic state '00'. The threshold voltage range of the logic state '01' is between the voltage $V_1$ and the voltage $V_2$, and the threshold voltage range of the logic state '00' is between the voltage $V_3$ and a maximum threshold voltage $V_{max}$, i.e. the threshold voltage range of the logic state '00' is higher than the voltage $V_3$. Moreover, if the second page programming operation is completed, the flag bit corresponding to the multi level cell is set to a low logic level (i.e. '0'). Next, programming the second page programming operation of the other adjacent multi level cells may be performed.

Figure 1C:
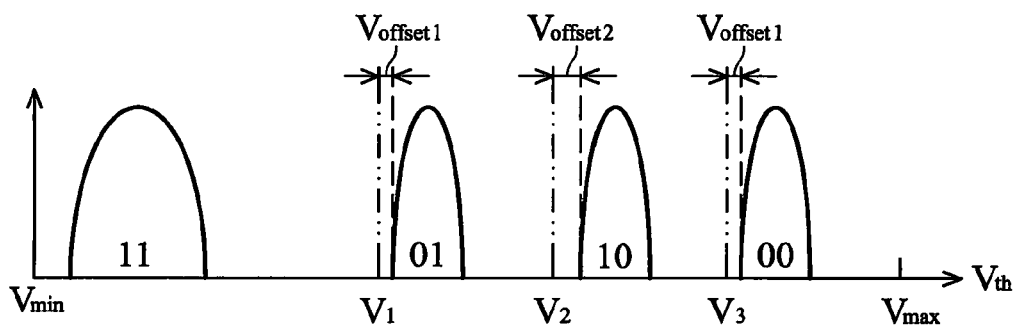
FIG. 1C shows a threshold voltage offset of the multi level cell shown in FIG. 1B caused by a coupling effect.
Figure 2C:
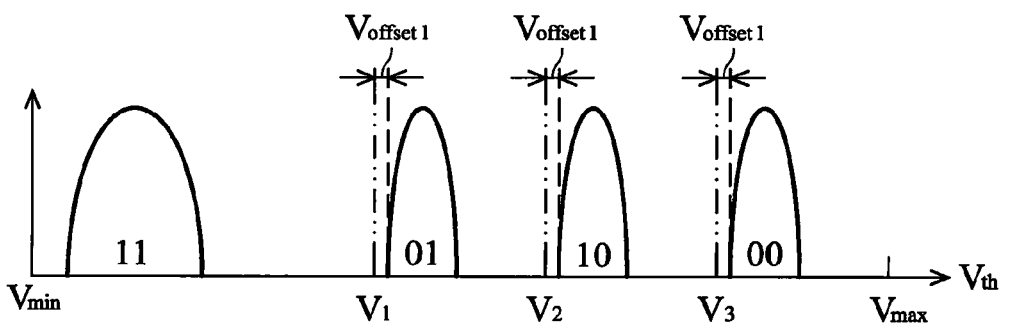
FIG. 2C shows a threshold voltage offset of the multi level cell shown in FIG. 2B caused by a coupling effect.

FIG. 2C shows a threshold voltage offset of the multi level cell shown in FIG. 2B caused by a coupling effect. The multi level cell may avoid the interferences from the first page programming operations of the other adjacent multi level cells when the two-bit data is in the logic state '10' due to the second page programming operation, thus decreasing the threshold voltage offset. As shown in FIG. 2C, if the two-bit data is in the logic state '01', '10' and '00', a offset $V_{offset1}$ between the practical threshold voltage range and the ideal threshold voltage range of the multi level cell exists due to the interferences caused by the second page programming operations of the other adjacent multi level cells and the coupling effect of floating gates. For the two-bit data with the logic state '10', the threshold voltage offset $V_{offset1}$ of the embodiment is smaller than the tradition threshold voltage offset $V_{offset2}$ shown in FIG. 1C. In the embodiment, a smaller threshold voltage offset is provided, thus accurately controlling the threshold voltage ranges of various logic states and increasing reliability.

Furthermore, in FIG. 2A, when performing the first page programming operation, a least significant bit of the two-bit data may be stored into the multi level cell. In FIG. 2B, when performing the second page programming operation, a most significant bit of the two-bit data may be stored into the multi level cell. Therefore, each bit of the two-bit data stored in the multi level cell is located on different pages (addresses), respectively.

After the first page or second page programming operation is completed, a reading operation is performed to obtain a read threshold voltage of the multi level cell, and the data stored in the multi level cell is determined according to the read threshold voltage. Referring to FIG. 2C, the logic state of the two-bit data stored in the multi level cell is '11' when the read threshold voltage is smaller than the voltage $V_1$. The logic state of the two-bit data stored in the multi level cell is '10' when the read threshold voltage is between the voltage $V_2$ and the voltage $V_3$. In addition, the logic state of the two-bit data stored in the multi level cell is '00' when the read threshold voltage is larger than the voltage $V_3$. It is to be noted, that if the read threshold voltage is between the voltage $V_1$ and the voltage $V_2$, the flag bit is used to determine the logic state of the two-bit data. For example, the logic state of the two-bit data stored in the multi level cell is '10' when the read threshold voltage is between the voltage $V_1$ and the voltage $V_2$ and the flag bit is in a high logic level, as shown in FIG. 2A. Otherwise, the logic state of the two-bit data stored in the multi level cell is '01' when the read threshold voltage is between the voltage $V_1$ and the voltage $V_2$ and the flag bit is in a low logic level, as shown in FIG. 2B.

Figure 3:
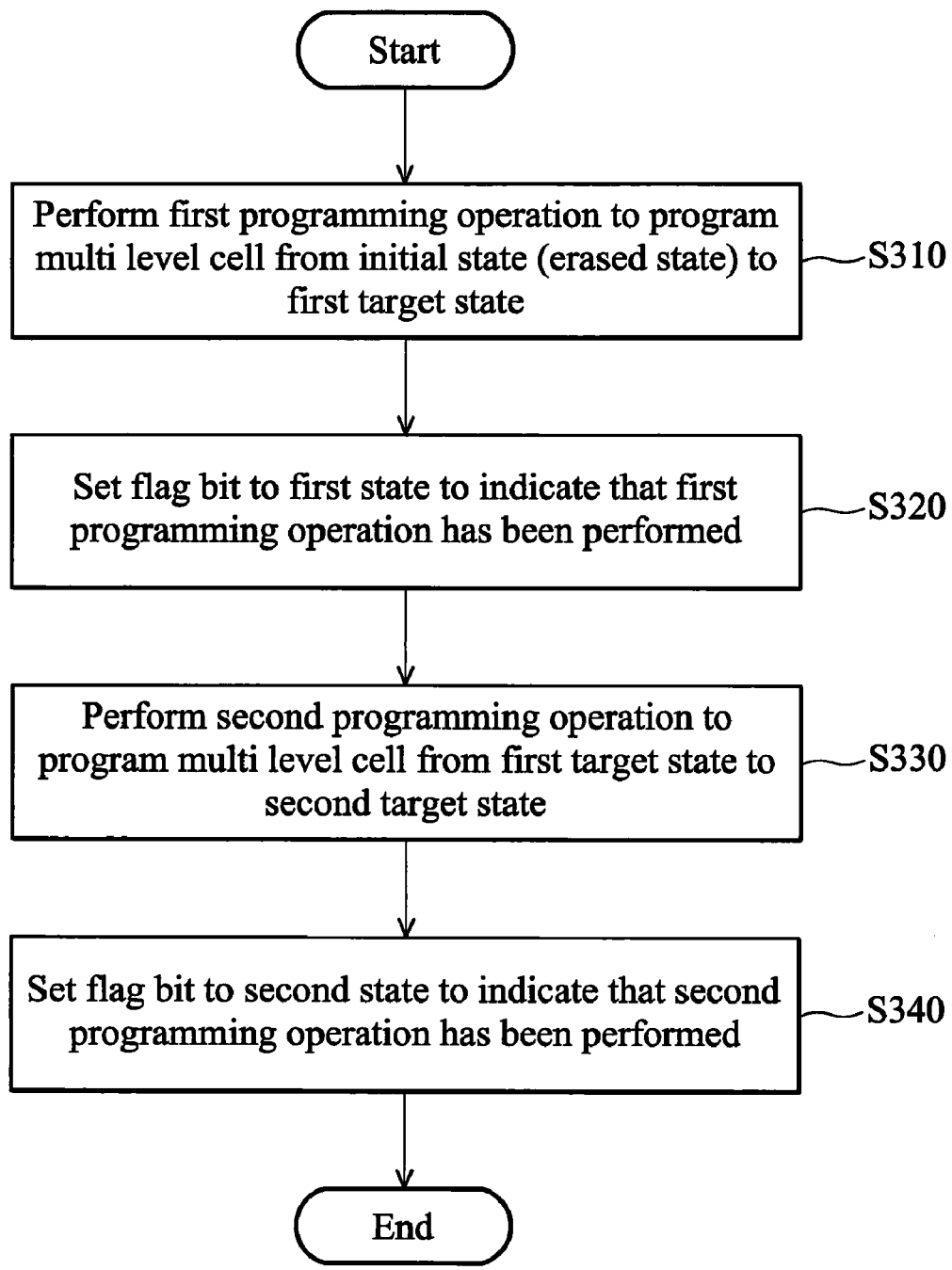
FIG. 3 shows a memory programming method according to an embodiment of the invention.

FIG. 3 shows a memory programming method 300 according to an embodiment of the invention. The memory programming method 300 may apply to a NAND flash with a plurality of multi level cells. First, in step S310, a first programming operation is performed to program a multi level cell from an initial state (i.e. an erase state) to a first target state. For example, as shown in the arrow D of FIG. 2A, the initial state corresponds to the logic state '11' and the first target state corresponds to the logic state '10', wherein a threshold voltage range of the first target state is between the voltage $V_1$ and the voltage $V_2$. Next, in step S320, a flag bit corresponding to the multi level cell is set to a first state (such as a high logic level) to indicate that the first programming operation has been performed. Next, in step S330, a second programming operation is performed to program the multi level cell from the first target state to a second target state. For example, as shown in the arrow E of FIG. 2B, the threshold range of the first target state is between the voltage $V_1$ and the voltage $V_2$, as shown in dotted line, and a threshold range of the second target state is between the voltage $V_2$ and the voltage $V_3$, wherein the first target state and the second target state both correspond to the same storage data, i.e. the two-bit data with the logic state '10'. Next, in step S340, the flag bit is set to a second state (such as a low logic level) to indicate that the second programming operation has been performed. As described above, the first programming operation and the second programming operation correspond to different addresses (pages), respectively.

Figure 4:
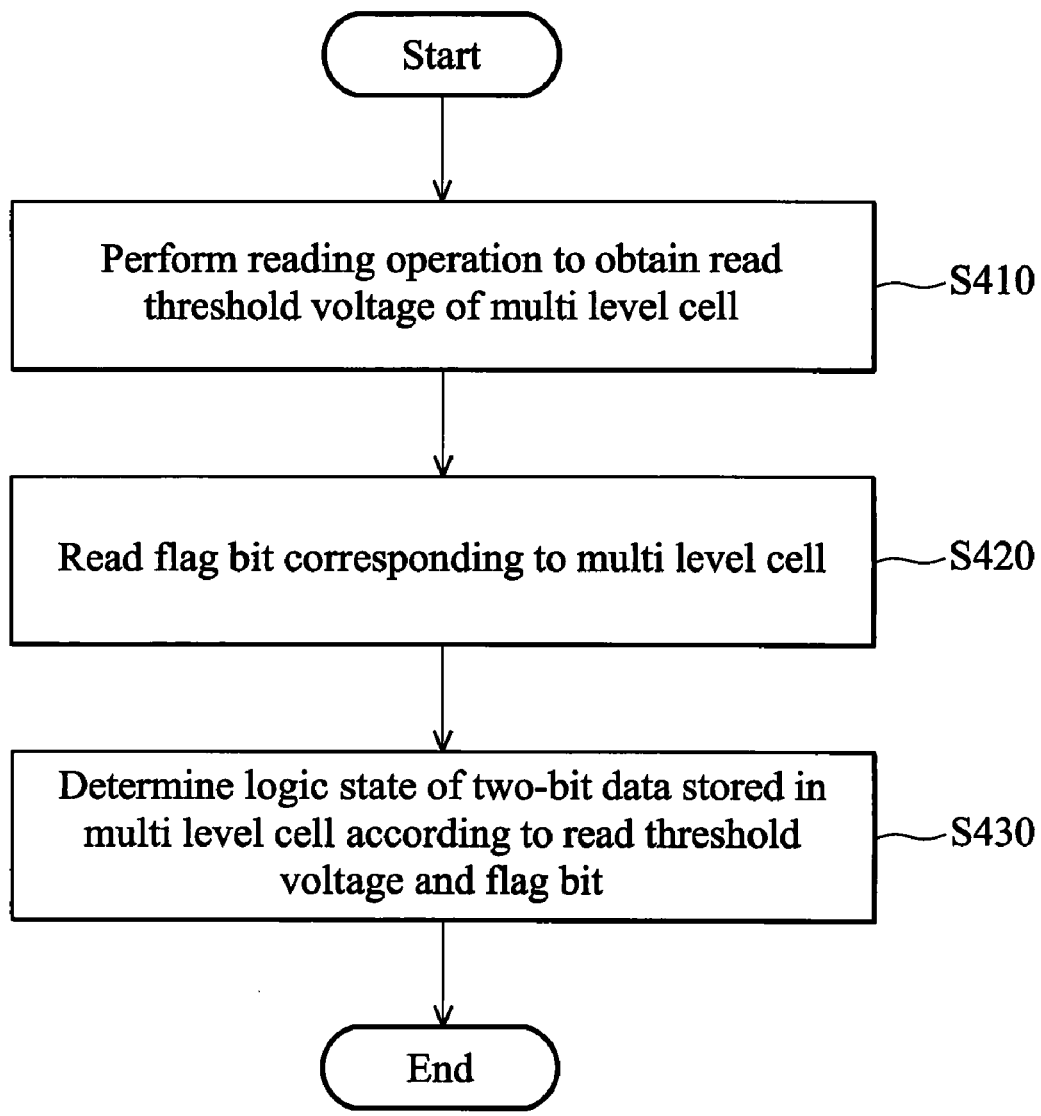
FIG. 4 shows a reading method 400 according to an embodiment of the invention.

FIG. 4 shows a reading method 400 according to an embodiment of the invention. First, in step S410, a reading operation is performed to obtain a read threshold voltage of a multi level cell. Next, in step S420, a flag bit corresponding to the multi level cell is read, wherein the flag bit may indicate whether the second programming operation described in step S330 of FIG. 3 is performed for the multi level cell. Next, in step S430, a logic state of a two-bit data stored in the multi level cell is determined according to the read threshold voltage and the flag bit. For example, referring to FIG. 2C, the logic state of the two-bit data stored in the multi level cell is '00' when the read threshold voltage is larger than the voltage $V_3$. Furthermore, referring to FIG. 2A, the logic state of the two-bit data stored in the multi level cell is '10' when the read threshold voltage is between the voltage $V_1$ and the voltage $V_2$ and the flag bit is in a high logic level.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A memory programming method for a NAND flash with a plurality of multi level cells, comprising:
    performing a first programming operation to program the multi level cell from an initial state to a first target state, which corresponds to a first storage data and has a first threshold voltage range, wherein the first threshold voltage range is between a first voltage and a second voltage larger than the first voltage;
    setting a flag bit of the NAND flash to a first state to indicate that the first programming operation has been performed;
    performing a second programming operation to program the multi level cell from the first target state to a second target state, which corresponds to the first storage data and has a second threshold voltage range, wherein the second threshold voltage range is between the second voltage and a third voltage larger than the second voltage; and
    setting the flag bit to a second state to indicate that the second programming operation has been performed.

2. The memory programming method as claimed in claim 1, further comprising:
    programming the multi level cell from the second target state to a third target state, which corresponds to a second storage data and has a third threshold voltage range, wherein the third threshold voltage range is between the third voltage and a maximum threshold voltage larger than the third voltage.

3. The memory programming method as claimed in claim 2, further comprising:
    programming the multi level cell from the initial state to a fourth target state, which corresponds to a third storage data and has a fourth threshold voltage range, wherein the fourth threshold voltage range is between the first voltage and the second voltage.

4. The memory programming method as claimed in claim 3, wherein the initial state corresponds to a fourth storage data and has a fifth threshold voltage range, wherein the first, second, third and fourth storage data are a two-bit data with logic state '10', '00', '01' and '11' respectively, and the fifth threshold voltage range is between a minimum threshold voltage and the first voltage larger than the minimum threshold voltage.

5. The memory programming method as claimed in claim 4, wherein the first programming operation is performed to store a least significant bit of the two-bit data into the multi level cell, and the least significant bit corresponds to a first address.

6. The memory programming method as claimed in claim 5, wherein the second programming operation is performed to store a most significant bit of the two-bit data into the multi level cell, and the most significant bit corresponds to a second address, wherein the first address and the second address are located on different pages of the NAND flash.

7. A data accessing method for a NAND flash with a plurality of multi level cells, comprising:
    performing a first programming operation to program the multi level cell from an initial state to a first target state, which corresponds to a first logic state of a two-bit data and has a first threshold voltage range, wherein the first threshold voltage range is between a first voltage and a second voltage larger than the first voltage;
    setting a flag bit of the NAND flash to a first state to indicate that the first programming operation has been performed;
    performing a second programming operation to program the multi level cell from the first target state to a second target state, which corresponds to the first logic state and has a second threshold voltage range, wherein the second threshold voltage range is between the second voltage and a third voltage larger than the second voltage;
    setting the flag bit to a second state to indicate that the second programming operation has been performed;
    performing a reading operation to obtain a read threshold voltage of the multi level cell; and
    determining a logic state of the two-bit data stored in the multi level cell according to the read threshold voltage and the flag bit.

8. The data accessing method as claimed in claim 7, further comprising:
    programming the multi level cell from the second target state to a third target state, which corresponds to a second logic state of the two-bit data and has a third threshold voltage range, wherein the third threshold voltage range is between the third voltage and a maximum threshold voltage larger than the third voltage.

9. The data accessing method as claimed in claim 8, further comprising:
    programming the multi level cell from the initial state to a fourth target state, which corresponds to a third logic state of the two-bit data and has a fourth threshold voltage range, wherein the fourth threshold voltage range is between the first voltage and the second voltage.

10. The data accessing method as claimed in claim 9, wherein the initial state corresponds to a fourth logic state of the two-bit data and has a fifth threshold voltage range, wherein the first, second, third and fourth logic states are '10', '00', '01' and '11' respectively, and the fifth threshold voltage range is between a minimum threshold voltage and the first voltage larger than the minimum threshold voltage.

11. The data accessing method as claimed in claim 10, wherein the first programming operation is performed to store a least significant bit of the two-bit data into the multi level cell, and the least significant bit corresponds to a first address.

12. The data accessing method as claimed in claim 10, wherein the second programming operation is performed to store a most significant bit of the two-bit data into the multi level cell, and the most significant bit corresponds to a second address, wherein the first address and the second address are located on different pages of the NAND flash.

13. The data accessing method as claimed in claim 10, wherein the step of determining the logic state of the two-bit data further comprises:
  determining the logic state of the two-bit data is '11' when the read threshold voltage is smaller than the first voltage.

14. The data accessing method as claimed in claim 10, wherein the step of determining the logic state of the two-bit data further comprises:
  determining the logic state of the two-bit data is '10' when the read threshold voltage is between the second voltage and the third voltage.

15. The data accessing method as claimed in claim 10, wherein the step of determining the logic state of the two-bit data further comprises:
  determining the logic state of the two-bit data is '00' when the read threshold voltage is larger than the third voltage.

16. The data accessing method as claimed in claim 10, wherein the step of determining the logic state of the two-bit data further comprises:
  determining the logic state of the two-bit data is '10' when the read threshold voltage is between the first voltage and the second voltage and the flag bit is in the first state; and
  determining the logic state of the two-bit data is '01' when the read threshold voltage is between the first voltage and the second voltage and the flag bit is in the second state.

\* \* \* \* \*